(12) United States Patent
Takayama et al.

(10) Patent No.: US 7,418,019 B2
(45) Date of Patent: Aug. 26, 2008

(54) MULTI-WAVELENGTH SEMICONDUCTOR LASER

(75) Inventors: Toru Takayama, Nara (JP); Isao Kidoguchi, Hyogo (JP); Takayuki Kashima, Okayama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 128 days.

(21) Appl. No.: 11/501,064

(22) Filed: Aug. 9, 2006

(65) Prior Publication Data

US 2007/0064752 A1    Mar. 22, 2007

(30) Foreign Application Priority Data

Sep. 22, 2005   (JP)   ............................. 2005-274827

(51) Int. Cl.
*H01S 5/00*   (2006.01)

(52) U.S. Cl. ............. 372/50.121; 372/50.1; 372/50.122
(58) Field of Classification Search ............. 372/50.121
See application file for complete search history.

(56) References Cited

U.S. PATENT DOCUMENTS

| | | | | |
|---|---|---|---|---|
| 5,663,975 A | * | 9/1997 | Yoshida et al. | ............ 372/46.01 |
| 2006/0176921 A1 | * | 8/2006 | Ueda et al. | ................ 372/43.01 |

FOREIGN PATENT DOCUMENTS

| | | | |
|---|---|---|---|
| JP | 11-186651 | | 7/1999 |
| JP | 2002-026447 | * | 1/2002 |
| JP | 2005-033077 | * | 2/2005 |

* cited by examiner

*Primary Examiner*—Dung T Nguyen
(74) *Attorney, Agent, or Firm*—Steptoe & Johnson LLP

(57) ABSTRACT

Semiconductor lasers for respective wavelengths have window regions with different lengths so as to obtain optimum FFPs for emitted light of the respective wavelengths, and thus dependence on optical output can be equal between the wavelengths, facilitating the design of an optical system.

16 Claims, 13 Drawing Sheets

MULTI-WAVELENGTH SEMICONDUCTOR LASER

FIELD OF THE INVENTION

The present invention relates to a multi-wavelength semiconductor laser in which semiconductor lasers for a red wavelength, an infrared wavelength, and so on are monolithically formed, the semiconductor laser being used as a light source required for a pickup light source of an optical disk drive, an electronic device, an information processor, and so on.

BACKGROUND OF THE INVENTION

Digital video discs (DVDs) allowing high-density recording with a large capacity and DVD devices for reproducing DVDs have been commercially available at present and received attention as products growing in demand. Since DVDs allow high-density recording, AlGaInP semiconductor lasers having an emission wavelength of 650 nm are used as laser light sources for recording/reproducing DVDs. Thus, the optical pickups of conventional DVD devices cannot reproduce compact discs (CDs) and Mini Discs (MDs) which are reproduced using AlGaAs semiconductor lasers having an emission wavelength of 780 nm.

In order to solve this problem, an optical pickup is used in which laser chips are incorporated into separate packages which include an AlGaInP semiconductor laser having an emission wavelength in the 650 nm band and an AlGaAs semiconductor laser having an emission wavelength in the 780 nm band. However, the optical pickup including the two packages of the AlGaInP semiconductor laser and the AlGaAs semiconductor laser has a large size, increasing the size of the DVD device. In order to solve this problem, an integrated semiconductor laser is provided in which two or more kinds of semiconductor lasers have different emission wavelengths and a light-emitting device structure is formed of semiconductor layers grown on the same substrate.

Referring to FIG. 13, such a conventional multi-wavelength semiconductor laser will be discussed below.

FIG. 13 is a perspective view showing the structure of a conventional multi-wavelength semiconductor laser.

As shown in FIG. 13, in the conventional multi-wavelength semiconductor laser, an AlGaAs semiconductor laser LD1 having an emission wavelength in the 700 nm band (for example, 780 nm) and an AlGaInP semiconductor laser LD2 having an emission wavelength in the 600 nm band (for example, 650 nm) are integrated separately on the same n-type GaAs substrate 201. The n-type GaAs substrate 201 is, for example, a substrate having a plane direction (100) or a substrate having a principle plane is off from the plane (100) by, for example, 5 to 15°.

In the AlGaAs semiconductor laser LD1, an n-type GaAs buffer layer 211, an n-type AlGaAs clad layer 212, an active layer 213 having a single quantum well (SQW) structure or a multiple quantum well (MQW) structure, a p-type AlGaAs clad layer 214, and a p-type GaAs cap layer 215 are sequentially stacked on the n-type GaAs substrate 201. The upper part of the p-type AlGaAs clad layer 214 and the p-type GaAs cap layer 215 are shaped like a stripe extending in one direction. An n-type GaAs current constriction layer 216 is provided on both sides of the stripe and forms a current constriction structure. On the stripe-like p-type GaAs cap layer 215 and the n-type GaAs current constriction layer 216, a p-side electrode 217 is in Ohmic contact with the p-type GaAs cap layer 215. The p-side electrode 217 is, for example, a Ti/Pt/Au electrode.

In the AlGaInP semiconductor laser LD2, an n-type GaAs buffer layer 221, an n-type AlGaInP clad layer 222, an active layer 223 having an SQW structure or an MQW structure, a p-type AlGaInP clad layer 224, a p-type GaInP intermediate layer 225, and a p-type GaAs cap layer 226 are sequentially stacked on the n-type GaAs substrate 201. The upper part of the p-type AlGaInP clad layer 224, the p-type GaInP intermediate layer 225, and the p-type GaAs cap layer 226 are shaped like a stripe extending in one direction. An n-type GaAs current constriction layer 227 is provided on both sides of the stripe and forms a current constriction structure. On the stripe-like p-type GaAs cap layer 226 and the n-type GaAs current constriction layer 227, a p-type electrode 228 is in Ohmic contact with the p-type GaAs cap layer 226. The p-type electrode 228 is, for example, a Ti/Pt/Au electrode.

On the back side of the n-type GaAs substrate 201, an n-side electrode 229 is in Ohmic contact with the n-type GaAs substrate 201. The n-side electrode 229 is, for example, an AuGe/Ni electrode or an In electrode.

In this case, the p-side electrode 217 of the AlGaAs semiconductor laser LD1 and the p-side electrode 228 of the AlGaInP semiconductor laser LD2 are respectively soldered on heat sinks H1 and H2 which are electrically separated from each other on a package base 300.

In the conventional multi-wavelength semiconductor laser configured thus, the AlGaAs semiconductor laser LD1 can be driven by passing current between the p-side electrode 217 and the n-side electrode 229 and the AlGaInP semiconductor laser LD2 can be driven by passing current between the p-side electrode 228 and the n-side electrode 229. Laser light having a wavelength of the 700 nm band (for example, 780 nm) can be extracted by driving the AlGaAs semiconductor laser LD1, and laser light having a wavelength of the 600 nm band (for example, 650 nm) can be extracted by driving the AlGaInP semiconductor laser LD2. The AlGaAs semiconductor laser LD1 and the AlGaInP semiconductor laser LD2 can be selectively driven by the switching of external switches and the like.

As described above, the conventional multi-wavelength semiconductor laser has the AlGaAs semiconductor laser LD1 having an emission wavelength in the 700 nm band and the AlGaInP semiconductor laser LD2 having an emission wavelength in the 600 nm band, and thus laser light for DVDs and laser light for CDs and MDs can be separately extracted. Therefore, DVDs, CDs, and MDs can be all reproduced or recorded by installing the multi-wavelength semiconductor laser as a laser light source in the optical pickup of a DVD device. The AlGaAs semiconductor laser LD1 and the AlGaInP semiconductor laser LD2 form a laser structure including the semiconductor layers grown on the same n-type GaAs substrate 201, so that only a single package of the integrated semiconductor laser is necessary. Thus the optical pickup can be minimized, reducing the size of the DVD device.

DISCLOSURE OF THE INVENTION

In the future, there will be an increasing demand for light sources for optical disc systems capable of high-speed writing on DVDs for 16× recording and CD-Rs for 48× recording with a recording function as well as a reproducing function. In this case, a laser used as a light source requires a high power operation of at least 200 mW or more.

Generally, when a semiconductor laser is caused to perform a high power operation, a resonator end face (front end face) from which laser light is extracted is coated with a dielectric film having a low reflectivity of 10% or less, and a resonator end face (rear end face) on the opposite side is coated with a dielectric film having a high reflectivity of 85% or more. Such coatings of low reflectivity (AR; Anti Reflection)/high reflectivity (HR; High Reflection) make it possible to improve external differential quantum efficiency (slope efficiency) in a current-optical output characteristic, achieve high optical output with a small amount of current injection, reduce the power density of laser light on the front end face during operations, and prevent COD (Catastrophic Optical Damage) in which the optical output of laser light causes melt fracture on the end face of the laser.

On the other hand, as described above, a high power operation of at least 200 mW or more is necessary for light sources for optical disc systems capable of high-speed writing on DVDs for 16× recording and CD-Rs for 48× recording. In order to obtain a high power operation of 200 mW or more, AR/HR coatings are applied to the end faces of the resonator of laser and an optical power density is reduced in a waveguide of the front end face from which laser light is extracted. Even in this case, power consumption increases during operations and heat is generated by an increase in absorption loss of light in the waveguide, so that the band gap of an active layer near the end face of the laser is reduced and laser light is absorbed on the end face of the laser, causing COD. As a result, the AR/HR coatings alone cannot secure reliability over several thousand hours.

It is therefore thought to be effective to increase the band gap of the active layer near the end face of the laser and prevent the occurrence of COD by diffusing impurity in the active layer on the end face of the laser and causing a quantum well active layer to act as a disordered window region. This is because, even when the band gap of the active layer in the window region near the end face decreases due to heat on the laser during operations, Auger recombination on the end face of the laser, or heat caused by a loss of light absorption in a band, the window region larger in band gap than the active layer causes a transparent state for laser light, that is, the wavelength of laser oscillation light is longer than a wavelength corresponding to the band gap of the window region, and thus absorption of laser light can be prevented in the window region.

With this window structure, a multi-wavelength semiconductor laser for DVDs and CD-Rs (hereinafter, referred to as a dual wavelength semiconductor laser) can achieve a dual wavelength light source for an optical disc system capable of high-speed writing.

The active layer is disordered by the diffusion of impurity in the window region, and thus the effective index of refraction of the waveguide is varied between the window region and a gain region where the active layer is not disordered. Therefore, a coupling loss of light occurs on the boundary of window region-gain region and light distribution is dispersed, so that light distribution in the window region changes relative to the resonator direction. Since the light distribution changes thus, a far field pattern (hereinafter, referred to as an FFP) of laser light emitted from the end face of the window changes with the length of the window region.

The FFP pattern considerably affects the light use efficiency of the lens in the optical system of an optical disc system, and thus it is necessary to form the FFP such that the full width at half maximum has the highest light use efficiency. When the window region has an improper length, however precisely the light distribution of the gain section is set, the size of the light distribution considerably changes and a desired half width cannot be obtained, seriously reducing the light use efficiency of the lens. As a result, it is not possible to obtain a light intensity required for high-speed recording in the optical system of an optical pickup, resulting in a practically serious problem.

Therefore, it is necessary to properly set the length of the window region so as to obtain a desired FFP relative to laser light emitted from the window.

An object of the present invention is to provide a multi-wavelength semiconductor laser which can facilitate the design of an optical system by means of a window structure in which for a multi-wavelength semiconductor laser device formed on the same substrate, the size of an FFP of laser light at each wavelength is stabilized to obtain a desired FFP pattern.

In order to attain the object, the multi-wavelength semiconductor laser of the present invention is a multi-wavelength semiconductor laser in which a plurality of semiconductor lasers with different output wavelengths are monolithically formed on one same substrate, the semiconductor laser comprising an active layer having a quantum well structure, and a mesa-shape ridge on the active layer, the semiconductor laser including a window region formed by diffusing impurity on the end face of the active layer, the window region having a different length for each of the plurality of semiconductor lasers.

The semiconductor lasers are an infrared semiconductor laser and a red semiconductor laser which are monolithically formed to make up a dual wavelength semiconductor laser.

The semiconductor laser with a shorter output wavelength has a longer window region.

A difference in length between the window regions is 5 to 15 μm.

The window region of the red semiconductor laser is 10 to 30 μm in length, the window region of the infrared semiconductor laser is 10 to 25 μm in length, and the window region of the red semiconductor laser is longer than that of the infrared semiconductor laser.

A difference in output wavelength between the active layer of a gain section and the active layer of the window region is larger in the red semiconductor laser than in the infrared semiconductor laser.

A difference in output wavelength between the active layer of the gain section and the active layer of the window region is 20 nm or more.

The window region is formed by diffusing a same impurity in the red semiconductor laser and the infrared semiconductor laser.

The impurity is diffused in the window region and a region within 40 μm from the window region in a resonator direction. The impurity includes Zn or Si.

The same semiconductor layer is formed on the side wall of the mesa-shape ridge in each of the semiconductor lasers.

The semiconductor layer is an AlInP current block layer. The same dielectric layer is formed on the side wall of the mesa-shape ridge in each of the semiconductor lasers.

The dielectric film is made of at least one of SiN, $SiO_2$, $TiO_2$, $Al_2O_3$, and amorphous silicon hydride, or a multilayer structure of these materials.

A distance to the end face of the nearest resonator from the end face of a contact layer for injecting current into the active layer is longer than the length of the window region.

Regarding a difference between the length of the window region and the distance to the end face of the nearest resonator from the end face of the contact layer for injecting current into the active layer, the difference is larger in the red semiconductor laser than in the infrared semiconductor laser.

DESCRIPTION OF THE EMBODIMENTS

The following will describe an embodiment of the present invention in accordance with the accompanying drawings.

Figure 1:
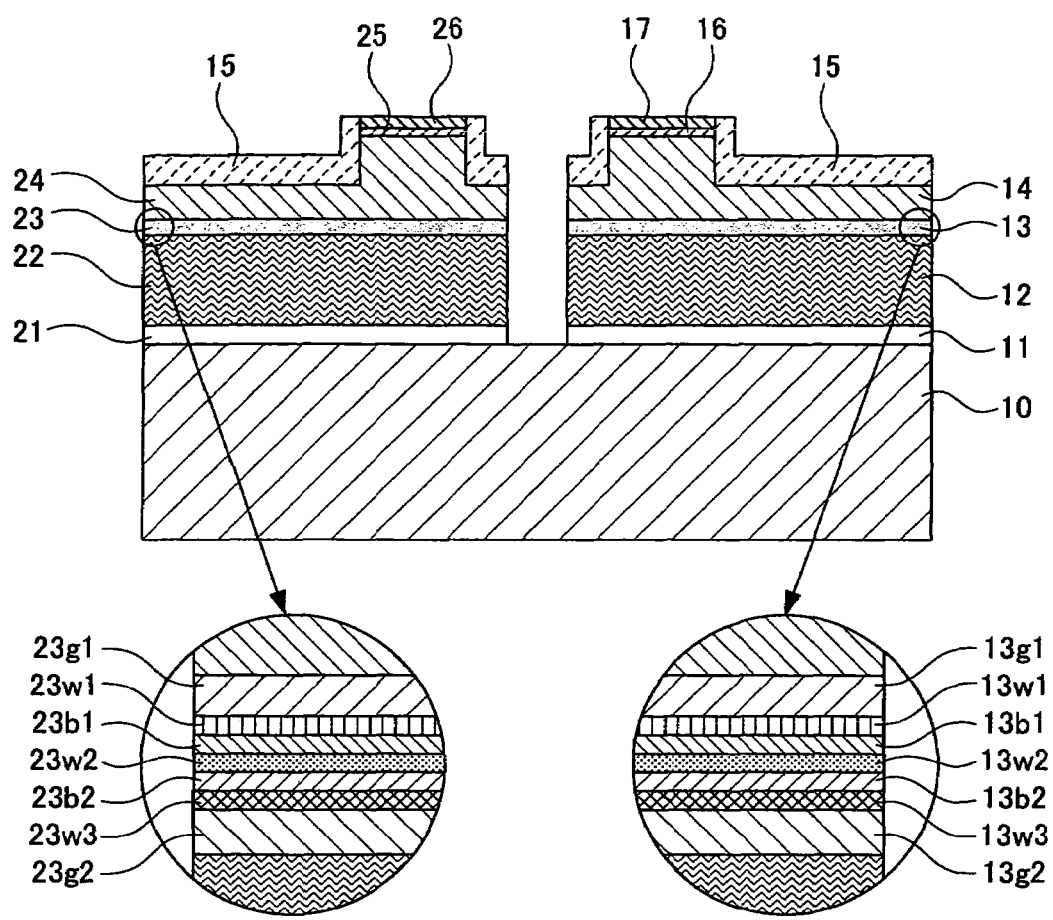
FIG. 1 is a sectional structural diagram schematically showing a multi-wavelength semiconductor laser of the present invention.

FIG. 1 is a sectional structural diagram schematically showing a multi-wavelength semiconductor laser of the present invention.

In this structure, on an n-type GaAs substrate 10 whose principle plane is tilted by 10° from a plane (100) in a direction [011], a red laser and an infrared laser are monolithically integrated. First, the structure of the red laser will be discussed below.

In the red laser, the following layers are formed: an n-type GaAs buffer layer 11 (0.5 µm), an n-type $(Al_{0.7}Ga_{0.3})_{0.51}In_{0.49}P$ clad layer 12 (2.0 µm), a strained quantum well active layer 13 including an $(Al_{0.5}Ga_{0.5})_{0.51}In_{0.49}P$ (500 Å) first guide layer 13g1+[$Ga_{0.48}In_{0.52}P$ (50 Å×3) well layers 13w1 to 13w3+$(Al_{0.5}Ga_{0.5})_{0.51}In_{0.49}P$ (50 Å×2) barrier layers 13b1 and 13b2]+an $(Al_{0.5}Ga_{0.5})_{0.51}In_{0.49}P$ (500 Å) second guide layer 13g2, a p-type $(Al_{0.7}Ga_{0.3})_{0.51}In_{0.49}P$ clad layer 14, a p-type $Ga_{0.51}In_{0.49}P$ protective layer 16 (500 Å), and a p-type GaAs contact layer (0.4 µm) 17.

In this case, the p-type $(Al_{0.7}Ga_{0.3})_{0.51}In_{0.49}P$ clad layer 14 is formed such that a distance between the top of a ridge and the active layer 13 is 1.4 µm and a distance dp between the lower end of the ridge and the active layer is 0.2 µm.

Further, an n-type AlInP current block layer (0.7 µm) 15 is formed on a side of the ridge. In this structure, current injected from the p-type GaAs contact layer 17 is constricted only in the ridge by the current block layer 15, and the current injection is concentrated on the active layer 13 disposed below the bottom of the ridge, so that the population inversion of carriers required for laser oscillation can be obtained by injecting only a small current of several tens mA. Light emitted at this time by the recombination of the carriers injected into the active layer is contained vertically in the clad layer 12 and the clad layer 14 in a direction perpendicular to the active layer, and the light is contained horizontally in the AlInP current block layer 15 in a direction in parallel with the active layer because the AlInP current block layer 15 has a lower index of refraction than the clad layer. Since the current block layer 15 is transparent relative to laser oscillation light, the current block layer 15 does not absorb light, achieving a low-loss waveguide. Light propagating through the waveguide can be largely distributed to the current block layer 15, and thus it is possible to easily obtain Δn of the order of $10^{-3}$ suitable for a high output operation and precisely control the size of Δn according to the size of dp similarly on the order of $10^{-3}$ where Δn represents a difference in effective index of refraction between the inside and outside of a current injection stripe. It is thus possible to obtain a high power semiconductor laser which has a low operation current while precisely controlling light distribution.

At this time, the bottom of the ridge has to be 3.0 μm or less in width in order to suppress high-order transverse mode oscillation. When the bottom of the ridge decreases in width, the top surface of the ridge also decreases in width according to the shape of a mesa. When the top surface of the ridge is too narrow, a differential resistance Rs increases after the rising edge of voltage in current-voltage characteristics, the superimposition of high-frequency current and the high-speed modulation characteristic of light output are degraded, and the operating voltage is increased, so that heat is generated. Generally the light source of a high-speed DVD system of 8× or more requires Rs of 5Ω or lower.

In the infrared layer, the following layers are formed: an n-type GaAs buffer layer 21 (0.5 μm), an n-type $(Al_{0.7}Ga_{0.3})_{0.51}In_{0.49}P$ clad layer 22 (2.0 μm), a quantum well active layer 23 including an $Al_{0.5}Ga_{0.5}As$ (200 Å) first guide layer 23g1+[GaAs30 Å×3 well layers 23w1 to 23w3+$(Al_{0.5}Ga_{0.5})As$(50 Å×2) barrier layers 23b1 and 23b2]+an $Al_{0.5}Ga_{0.5}As$ (200 Å) second guide layer 23g2, a p-type $(Al_{0.7}Ga_{0.3})_{0.51}In_{0.49}P$ clad layer 24, a p-type $Ga_{0.51}In_{0.49}P$ protective layer 25 (500 Å) and a p-type GaAs contact layer (0.4 μm) 26.

In this case, the p-type $(Al_{0.7}Ga_{0.3})_{0.51}In_{0.49}P$ clad layer 24 is formed such that a distance between the top of a ridge and the active layer 23 is 1.4 μm and a distance dp between the lower end of the ridge and the active layer is 0.24 μm.

Further, an n-type AlInP current block layer (0.7 μm) 15 is formed on a side of the ridge. In this structure, current injected from the p-type GaAs contact layer 26 is constricted only in the ridge by the current block layer 15, and the current injection is concentrated on the active layer 23 disposed below the bottom of the ridge, so that the population inversion of carriers required for laser oscillation can be obtained by injecting only a small current of several tens mA. Light emitted at this point by the recombination of the carriers injected into the active layer 23 is contained vertically in the clad layers 22 and 24 in a direction perpendicular to the active layer 23, and the light is contained horizontally in the AlInP current block layer 15 in a direction in parallel with the active layer 23 because the AlInP current block layer 15 has a lower index of refraction than the clad layer. Since the current block layer 15 is transparent relative to laser oscillation light, the current block layer 15 does not absorb light, achieving a low-loss waveguide. Light propagating through the waveguide can be largely distributed to the current block layer 15, and thus it is possible to easily obtain, as in the red laser, Δn of the order of $10^{-3}$ suitable for a high output operation and precisely control the size of Δn according to the size of dp similarly on the order of $10^{-3}$. It is thus possible to obtain a high power semiconductor laser which has a low operation current while precisely controlling light distribution.

At this time, the bottom of the ridge has to be 3.2 μm or less in width in order to suppress high-order transverse mode oscillation. When the bottom of the ridge decreases in width, the top surface of the ridge also decreases in width according to the shape of a mesa. When the top surface of the ridge is too narrow, Rs increases, the superimposition of high-frequency current and the high-speed modulation characteristic of light output are degraded, and the operating voltage is increased, so that heat is generated. Generally the light source of a high-speed DVD system of 8× or more requires Rs of 5Ω or lower.

During a high-temperature operation at 70° C., the length of a resonator is set at 1300 μm or more to reduce leakage current in a high power laser of 200 mW or more, thereby reducing an operation current density. In the present embodiment, the resonator has a length of 1400 μm.

The front end face and the rear end face of the resonator are coated with dielectric films which have a reflectivity of 7% relative to infrared laser light and a reflectivity of 94% relative to red laser light, respectively.

Figure 2:
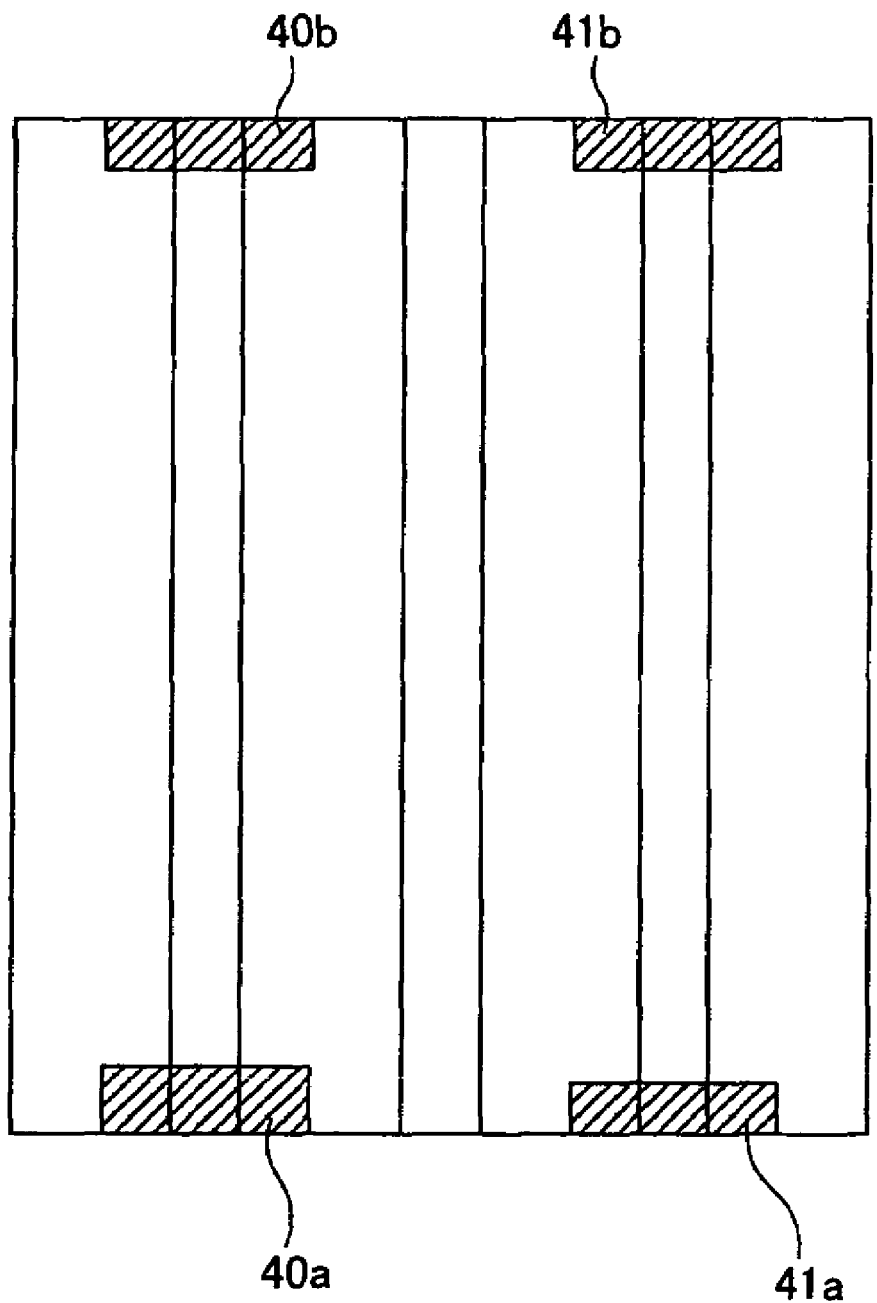
FIG. 2 is a plan view showing a window structure of the multi-wavelength semiconductor laser of the present invention.

FIG. 2 is a plan view showing the window structure of the multi-wavelength semiconductor laser of the present invention.

As shown in FIG. 2, the quantum well active layer near the end face of the resonator is disordered by diffusing impurity using Zn or Si and has window regions which are larger in band gap energy than the active layer of the gain section and transparent relative to laser oscillation light. A front end face window region 41a (25 μm in length) and a rear end face window region 41b (25 μm in length) are formed on the front end face/rear end face of the infrared laser, and a frond end face window region 40a (30 μm in length) and a rear end face window region 40b (25 μm in length) are formed on the front end face/rear end face of the red laser.

Since the window regions are formed near the end faces of the resonator, even when the window regions are larger in band gap energy than the active layer and even when the active layer in the window region near the end face decreases in band gap energy due to heat in the laser during operations, Auger recombination on the end face of the laser, and heat caused by a loss of light absorption in a band, it is possible to keep a transparent state relative to laser light, that is, the wavelength of laser oscillation light can be kept longer than a wavelength corresponding to the band gap of the window region. It is thus possible to prevent absorption of laser light in the window region, so that the semiconductor laser having the window structure can be operated up to an optical output allowing heat saturation without COD.

Incidentally, in the window region, the active layer is disordered by the diffusion of impurity, and thus the effective index of refraction of the waveguide is varied between the window region and a gain region where the active layer is not disordered. Thus a propagation constant received by guided light is varied between the gain section and the window section, a coupling loss of light occurs, and light distribution is dispersed on the boundary of window region-gain region, so that light distribution in the window section changes relative to the resonator direction. Since the light distribution changes thus, a far field pattern (FFP) of laser light emitted from the end face of the window changes with the length of the window region.

Figure 3:
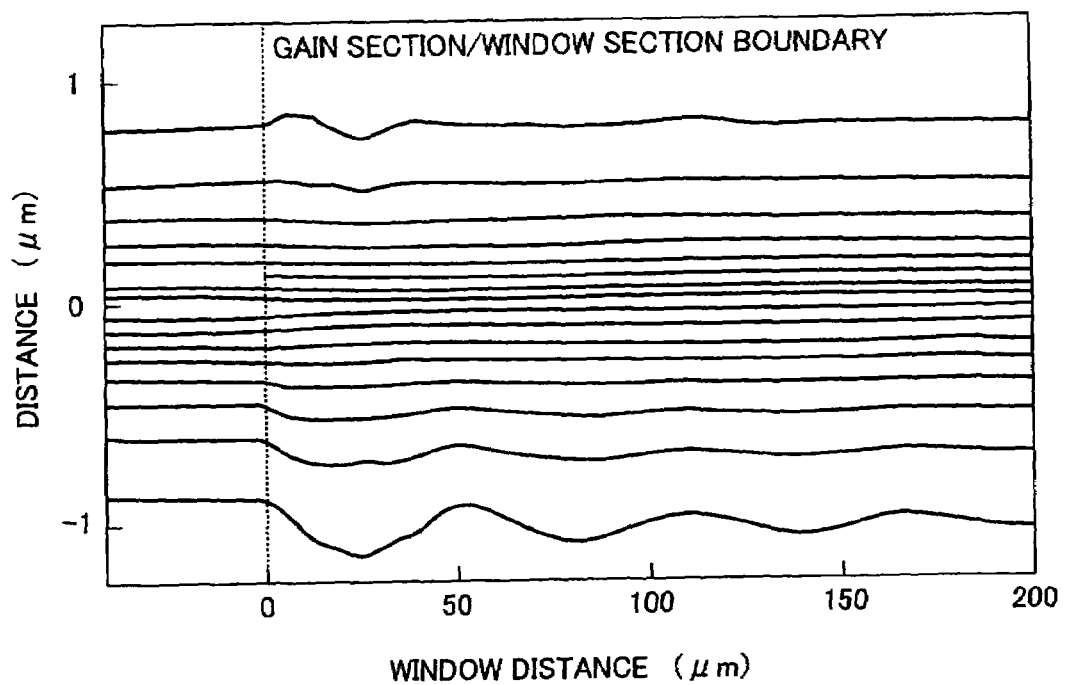
FIG. 3 is a diagram showing calculation results on the dependence of the light distribution intensity distribution of laser light on a window length, the laser light being guided through the window in the multi-wavelength semiconductor laser of the present invention.

FIG. 3 is a diagram showing calculation results on the dependence, on a window length, of the light distribution intensity distribution of laser light guided through the window in the multi-wavelength semiconductor laser of the present invention. FIG. 3 shows calculation results on dependence, on a window length, of the light distribution intensity distribution (intensity distribution in the direction of upper and lower clad layers when the center position in the active layer is 0 μm relative to the thickness direction of a growth layer) of laser light guided through the window in the structure of the red laser in the semiconductor laser of the present invention. Contour lines indicate light intensity vertically attenuated by 10% relative to the light intensity of 1 at the position of 0-μm distance.

As shown in FIG. 3, in the window, the width of light distribution intensity fluctuates in the resonator direction in the window region from the window section/gain section boundary. Since a propagation constant varies between the window section/gain section, the width of light distribution varies between the window section/gain section. Thus guided light having been dispersed on the boundary interferes with light distribution which has not been dispersed but coupled with the window, so that the expansion of light distribution fluctuates relative to the window length direction. In the windows of the red laser in the semiconductor laser according to the present embodiment, the width of light distribution fluctuates with a period of about 50 μm.

It is thus expected that the full width at half maximum of an FFP emitted from the end face of the laser also fluctuates due to the window length.

The FFP considerably affects the light use efficiency of a lens in the optical system of an optical disc system, and thus it is necessary to form the FFP such that the full width at half maximum has the highest light use efficiency. When the window region has an improper length, however precisely the light distribution of the gain section is set, the size of the light distribution considerably changes and a desired half width cannot be obtained, seriously reducing the light use efficiency of the lens. As a result, it is not possible to obtain a light intensity required for high-speed recording in the optical system of the optical pickup, resulting in a practically serious problem.

Therefore, it is necessary to properly set the length of the window region so as to obtain a desired FFP relative to laser light emitted from the window.

In the multi-wavelength laser made of different active layer materials, the index of refraction is varied among the active layers and thus it is necessary to set the window lengths at different values. When multi-wavelength lasers are integrated on the same substrate, the formation of windows in the same impurity dispersion process is advantageous for reducing the number of steps in the fabrication of devices. Therefore, it is not possible to separately set the dispersion states of impurity and it becomes difficult to set process conditions for separately optimizing changes in the distribution of the index of refraction, the distribution being changed by the dispersion of impurity in the windows. For this reason, when multi-wavelength lasers are integrated on the same substrate, it is necessary to set different window lengths for a plurality of semiconductor lasers in order to obtain a desired FFP.

Hence, as shown in FIG. 2, the lengths of the window regions are different in each of the semiconductor lasers. In the example of FIG. 2, the window region of the infrared laser is shorter than that of the red laser.

Figure 4A:
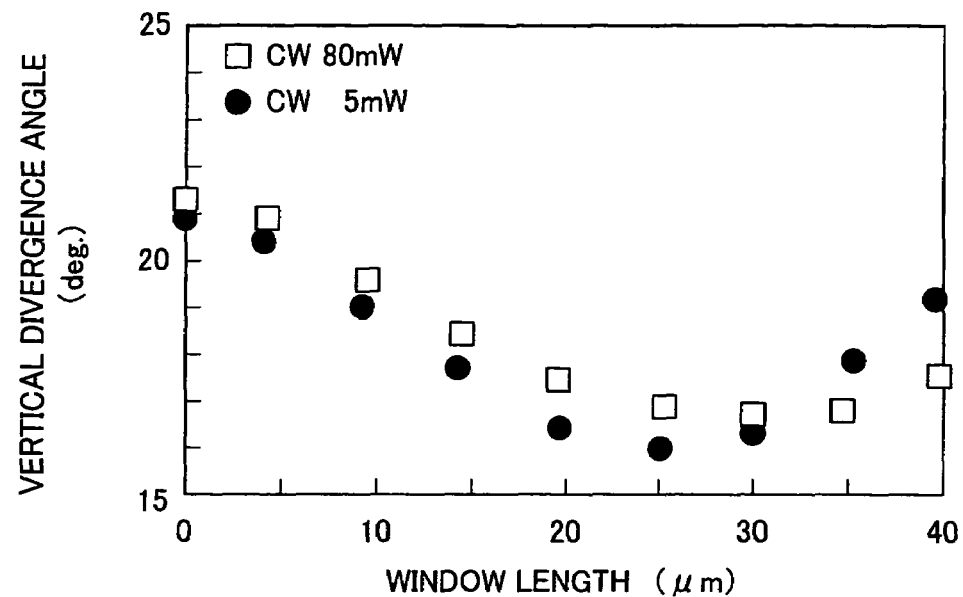
FIG. 4A is a diagram showing the dependence of the divergence angle of a red laser of the present invention on the window length.
Figure 4B:
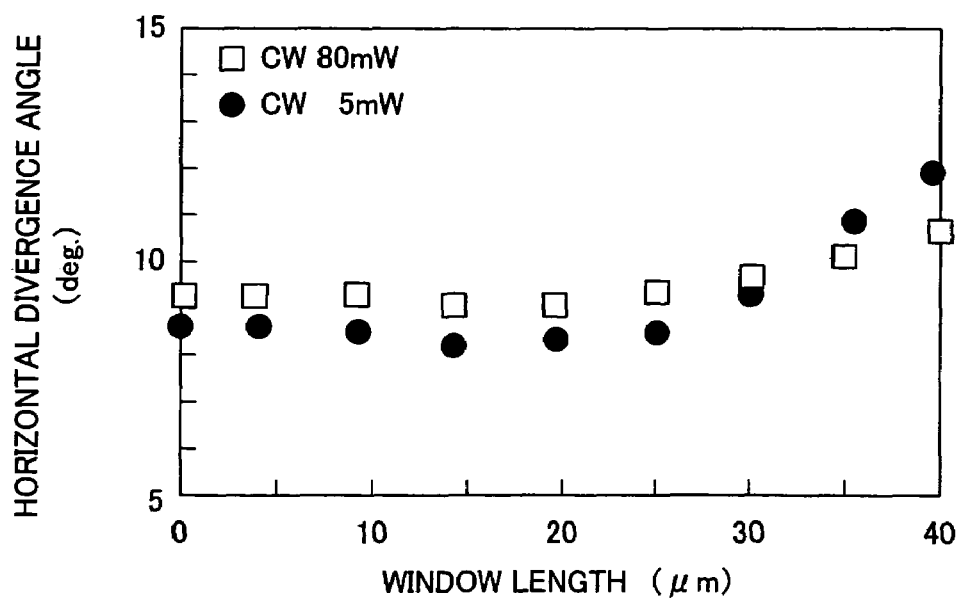
FIG. 4B is a diagram showing the dependence of the divergence angle of the red laser of the present invention on the window length.

FIG. 4 is a diagram showing the dependence of a divergence angle of the red laser of the present invention on a window length. FIG. 4(A) shows the dependence of a vertical divergence angle on a window length, and FIG. 4(B) shows the dependence of a horizontal divergence angle on a window length.

At a low output of 5 mW, the longer window length, the smaller vertical divergence angle. The vertical divergence angle reaches the minimum value of 16° at the window length of 25 μm, and then increases with the window length. This is because vertical light distribution in the window reaches the maximum width around the window length of 25 μm.

The horizontal divergence angle tends to somewhat decrease but is kept almost constant at about 8.5° up to the window length of about 25 μm. And then, the horizontal divergence angle increases with the window length. This is because when the window length increases to 25 μm or more, guided light having been dispersed on the boundary of the gain section and the window increases the width of horizontal light distribution, thereby increasing the horizontal divergence angle.

FIG. 4 also shows the dependence of the vertical and horizontal divergence angles in a red part on a window length at the optical output of 80 mW. As the optical output increases, a rate of change of the vertical divergence angle relative to the window length decreases and reaches the minimum value around the window length of 30 μm. The horizontal divergence angle also tends to somewhat decrease up to the window length of about 30 μm, and then the horizontal divergence angle increases with the window length. It is estimated that an increase in optical output increases the density of operating carriers in the active layer, and thus a plasma effect reduces the index of refraction of the active layer and brings the real part of the propagation constant of the gain section closer to the relatively small real part of the propagation constant of the window, thereby increasing a distance affected by interference. The real part of the propagation constant of the window is smaller than that of the gain section. This is because the active layer of the window is larger in band gap energy than the gain section and the real index of refraction decreases.

These results indicate that the window length should be set at about 30 μm to keep the FFP almost constant relative to the optical output in the red laser.

Figure 5A:
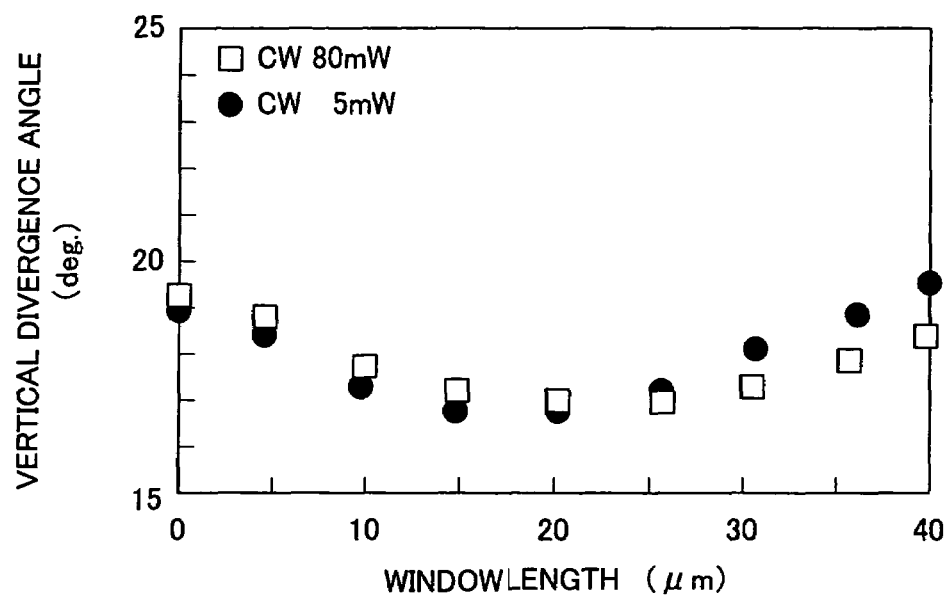
FIG. 5A is a diagram showing the dependence of the divergence angle of an infrared laser of the present invention on the window length.
Figure 5B:
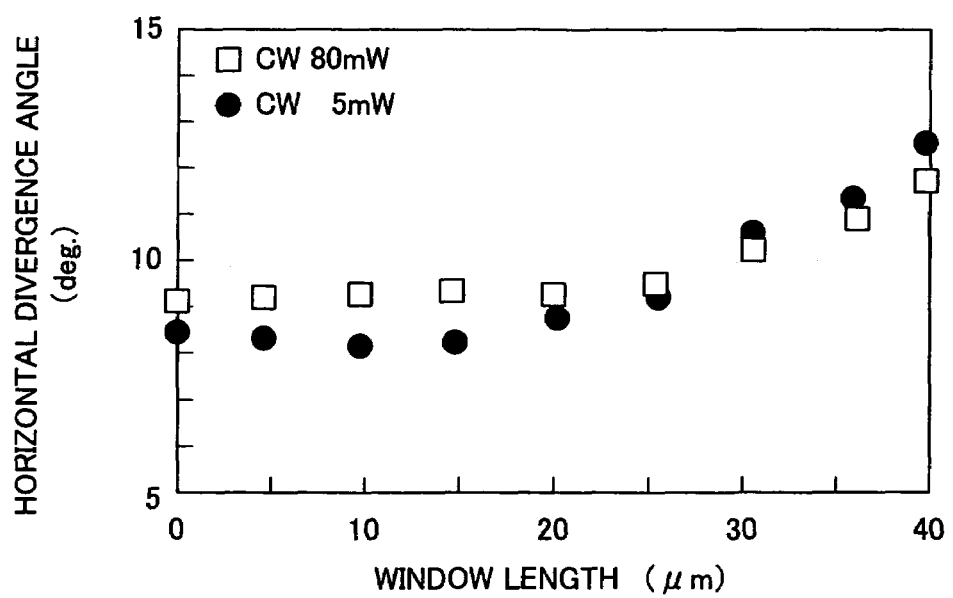
FIG. 5B is a diagram showing the dependence of the divergence angle of the infrared laser of the present invention on the window length.

FIG. 5 is a diagram showing the dependence of the divergence angle of the infrared laser of the present invention on a window length. FIG. 5(A) shows the dependence of a vertical divergence angle on a window length, and FIG. 5(B) shows the dependence of a horizontal divergence angle on a window length.

At a low output of 5 mW, the longer window length, the smaller vertical divergence angle. The vertical divergence angle reaches the minimum value of 17° at the window length of 20 μm, and then increases with the window length. This is because vertical light distribution in the window reaches the maximum width around the window length of 20 μm.

The horizontal divergence angle tends to somewhat decrease up to the window length of about 20 μm. The horizontal divergence angle reaches the minimum value of about 8°, and then increases with the window length. This is because when the window length increases to 20 μm or more, guided light having been dispersed on the boundary of the gain section and the window increases the width of horizontal light distribution, thereby increasing the horizontal divergence angle.

FIG. 5 also shows the dependence of the vertical and horizontal divergence angles in the red part on a window length at the optical output of 80 mW. As the optical output increases, a rate of change of the vertical divergence angle decreases relative to the window length and reaches the minimum value around the window length of 25 μm. The horizontal divergence angle also tends to somewhat decrease up to the window length of about 25 μm, and then the horizontal divergence angle increases with the window length. It is estimated that an increase in optical output increases the density of operating carriers in the active layer, and thus a plasma effect reduces the index of refraction of the active layer and brings the real part of the propagation constant of the gain section closer to the real part of the propagation constant of the window, thereby increasing a distance affected by interference. The real part of the propagation constant of the window is smaller than that of the gain section.

These results indicate that the window length should be set at about 25 μm to keep the FFP almost constant relative to the optical output in the infrared laser.

Further, regarding the distance where the FFP is kept almost constant relative to the optical output and the distance where the vertical divergence angle has the minimum value, the values of the infrared laser are about 5 μm smaller than those of the red laser. This is because, as will be described later, a difference of a PL waveform between the gain section and the window section of the active layer of an infrared part is larger than a difference of a PL waveform between the gain section and the window section of the active layer of the red section and thus a change in the effective index of refraction of the gain section/window in the infrared laser is smaller than a change in the effective index of refraction of the gain section/window in the red laser, so that light distribution is less dispersed on the gain section/window boundary in the infrared laser as compared with the red laser and thus a change of light intensity distribution in the optical axis direction has an extreme value at a short window length.

Hence, for example, when the red laser has a window length of 20 μm and the infrared laser has a window length of 15 μm, it is possible to obtain a dual wavelength laser allowing the optical output of the horizontal and vertical divergence angles to almost linearly change in the red and infrared lasers.

As described above, the window length of the red semiconductor laser is set about 5 μm longer than that of the infrared semiconductor laser. Thus when the infrared semiconductor laser and the red semiconductor laser are designed in the same optical system, light use efficiency in the dual wavelength optical system depends on optical output almost similarly at two wavelengths, facilitating the design of the optical system including a lens.

It is desirable that the window be at least 10 μm in length in consideration of a margin in the manufacturing process and a cleavage error in the formation of the resonator. According to the results of FIGS. 4 and 5, in order to keep almost constant the dependence of the FFP on the optical output with a window length of 10 μm or more, the window length of the infrared laser has to be set at 10 to 25 μm and the window length of the red laser has to be set at 10 to 30 μm. Particularly by setting the window of the red laser 5 μm longer than that of the infrared laser, a rate of change of the FFP relative to the optical output can be almost equal between the infrared laser and the red laser.

The window serves as a loss section because current is not injected and a gain is not provided. For this reason, it is preferable to minimize the window length. As shown in FIG. 5, in the infrared laser, changes of the horizontal and vertical divergence angles relative to the window length start decreasing when the window length is about 10 μm. Thus when the window length is set at 15 μm, by setting the window length of the red laser about 5 to 15 μm longer than that of the infrared part, that is, setting the window length at 20 to 30 μm, it is possible to set a stable region allowing changes of the horizontal and vertical divergence angles to decrease in the dual wavelength laser of an infrared laser and a red laser.

Figure 6A:
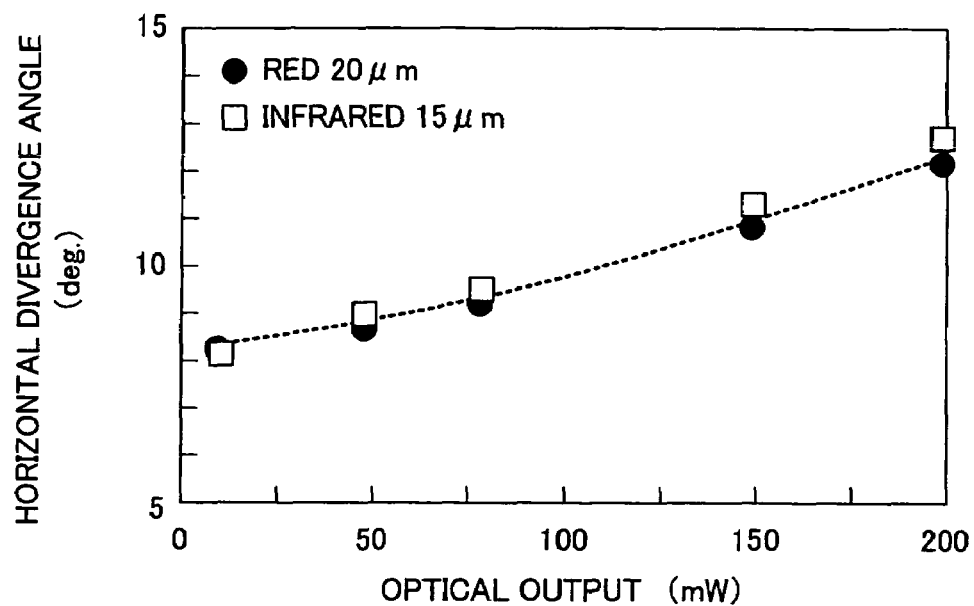
FIG. 6A is a diagram showing the optical output dependence of the divergence angle of a dual wavelength semiconductor laser in which an infrared laser has a window length of 15 µm and a red laser has a window length of 20 µm.
Figure 6B:
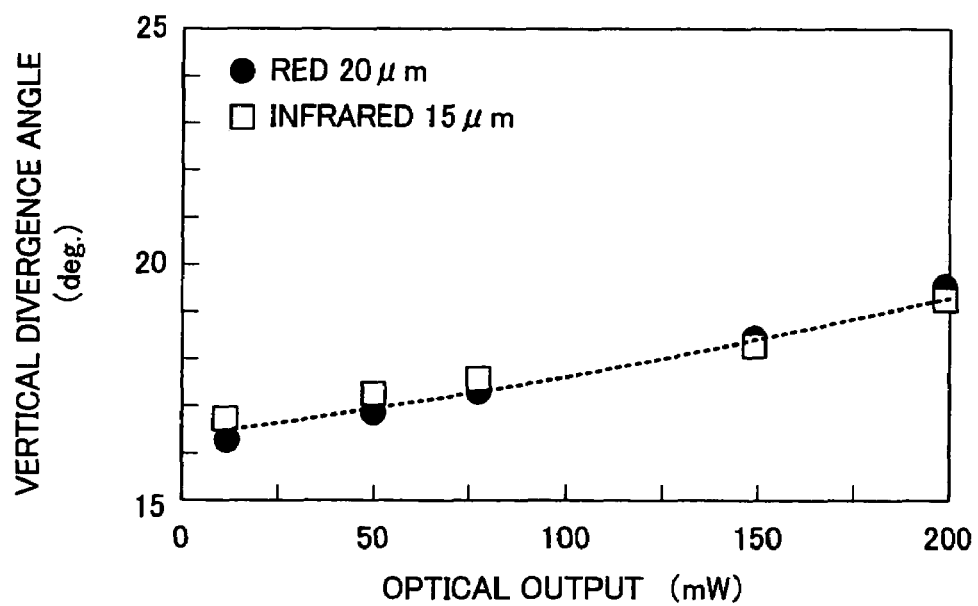
FIG. 6B is a diagram showing the optical output dependence of the divergence angle of the dual wavelength semiconductor laser in which the infrared laser has a window length of 15 µm and the red laser has a window length of 20 µm.

FIG. 6 is a diagram showing the dependence of the divergence angle of the dual wavelength laser on the optical output. The infrared semiconductor laser has a window length of 15 μm and the red semiconductor laser has a window length of 20 μm. FIG. 6(A) shows the dependence of a vertical divergence angle on the optical output, and FIG. 6(B) shows the dependence of a horizontal divergence angle on the optical output.

FIG. 6 shows that a rate of change of the dependence of the FFP size on the optical output is almost equal between the infrared semiconductor laser and the red semiconductor laser. In this way, the length of the window region is set for each of the semiconductor lasers of the respective wavelengths such that a rate of change of the dependence of the FFP size on the optical output is almost equal between the semiconductor lasers, thereby facilitating the design of a multi-wavelength optical system.

FIG. 7 is a diagram showing the dependence of the divergence angle of the dual wavelength laser on the optical output.

Figure 7A:
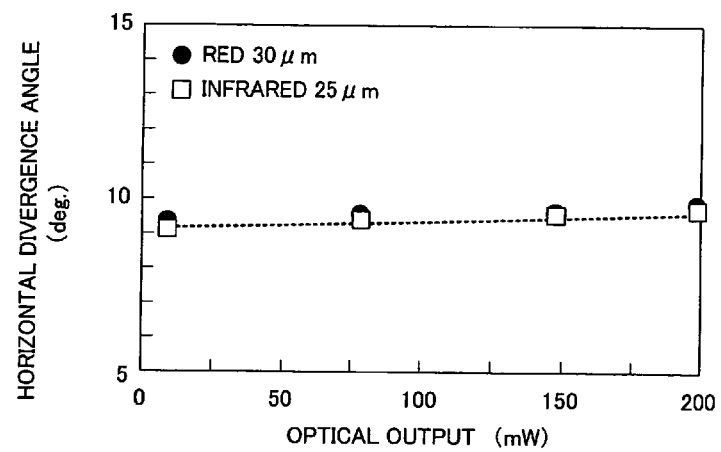
FIG. 7A is a diagram showing the optical output dependence of the divergence angle of the dual wavelength semiconductor laser in which the infrared laser has a window length of 25 µm and the red laser has a window length of 30 µm.
Figure 7B:
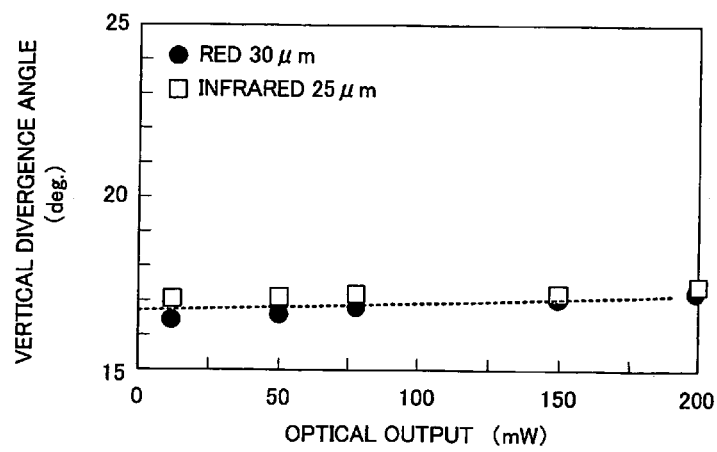
FIG. 7B is a diagram showing the optical output dependence of the divergence angle of the dual wavelength semiconductor laser in which the infrared laser has a window length of 25 µm and the red laser has a window length of 30 µm.

The infrared semiconductor laser has a window length of 25 μm and the red semiconductor laser has a window length of 30 μm. FIG. 7(A) shows the dependence of a vertical divergence angle on the optical output, and FIG. 7(B) shows the dependence of a horizontal divergence angle on the optical output.

FIG. 7 shows that the dependence of the FFP size on the optical output is quite low and almost equal in the infrared semiconductor laser and the red semiconductor laser. In this case, it is quite easy to design the dual wavelength optical system.

Figure 8:
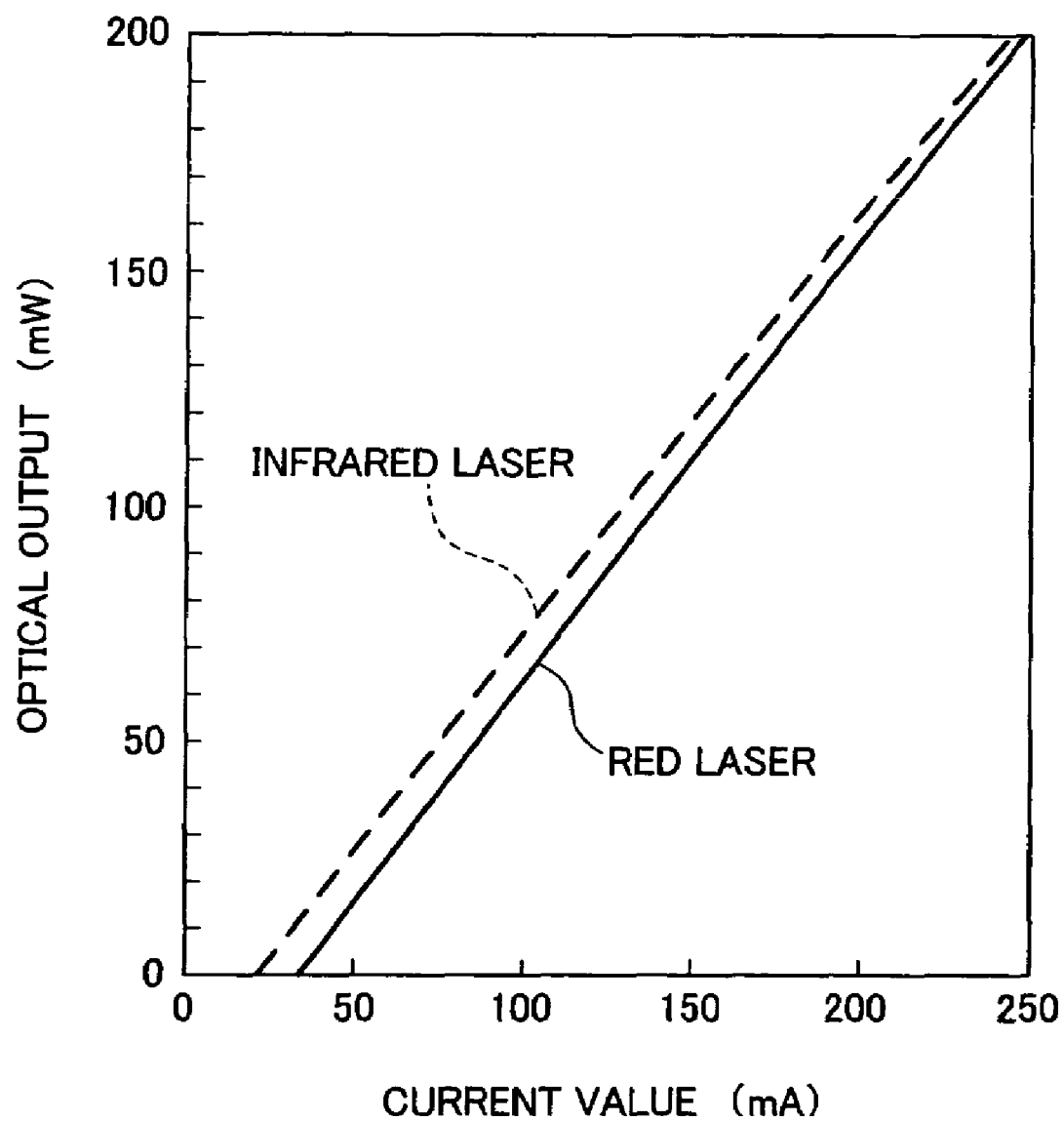
FIG. 8 is a diagram showing current-optical output dependence at room temperature CW in the dual wavelength semiconductor laser of the present embodiment.

FIG. 8 is a diagram showing current-optical output dependence at room temperature CW in the dual wavelength laser according to the present embodiment. FIG. 8 shows that COD is prevented by the window regions even in a high power operation of 200 mW or more in the infrared semiconductor laser and the red semiconductor laser.

Referring to FIGS. 9 and 10, the following will discuss a method of manufacturing the semiconductor laser according to the present invention.

FIG. 9 is a process sectional view showing the process of forming the semiconductor layers of the dual wavelength semiconductor laser according to the present invention. FIG. 10 is a process sectional view showing the process of forming the ridges of the dual wavelength semiconductor laser according to the present invention.

Figure 9A:
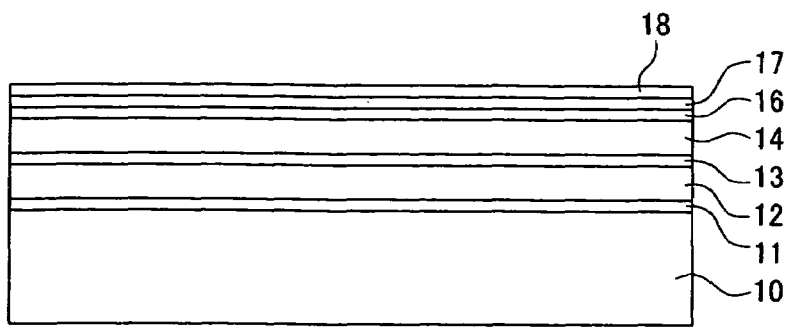
FIG. 9A is a process sectional view showing the process of forming semiconductor layers in the dual wavelength semiconductor laser of the present invention.

First, in a first crystal growing process using MOCVD method or MBE method, on the n-type GaAs substrate 10 whose principle plane is tilted by 10° from the plane (100) in the direction [011], the following layers are formed: the n-type GaAs buffer layer 11 (0.5 μm), the n-type $(Al_{0.7}Ga_{0.3})_{0.51}In_{0.49}P$ clad layer 12 (2.0 μm), the strained quantum well active layer 13 including the $(Al_{0.5}Ga_{0.5})_{0.51}In_{0.49}P$ (500 Å) first guide layer 13g1+the [$Ga_{0.48}In_{0.52}P$ (50 Å×3) well layers 13w1 to 13w3+the $(Al_{0.5}Ga_{0.5})_{0.51}In_{0.49}P$ (50 Å×2) barrier layers 13b1 and 13b2]+the $(Al_{0.5}Ga_{0.5})_{0.51}In_{0.49}P$ (500 Å) second guide layer 13g2, the p-type $(Al_{0.7}Ga_{0.3})_{0.51}In_{0.49}P$ clad layer 14, the p-type $Ga_{0.51}In_{0.49}P$ protective layer 16 (500 Å), the p-type GaAs contact layer (0.4 μm) 17, and a p-type $Ga_{0.51}In_{0.49}P$ boundary layer 18 (0.5 Å) (FIG. 9(A)).

In the present embodiment, a strained quantum well is used in the active layer 13. An unstrained quantum well or a bulk may be used. Although the conductivity type of the active layer 13 is not particularly described, the active layer 13 may be p-type, n-type, or undoped.

Figure 9B:
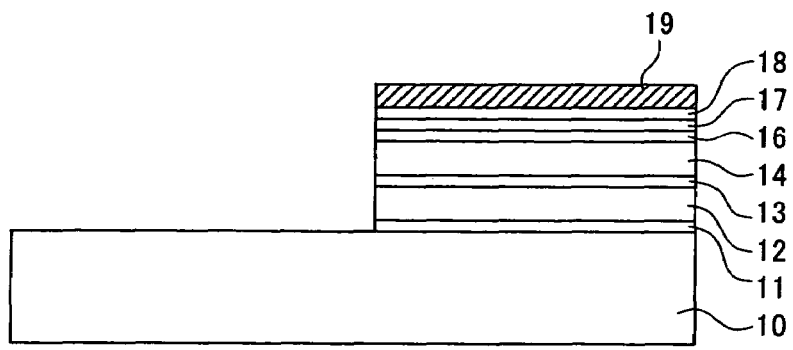
FIG. 9B is a process sectional view showing the process of forming semiconductor layers in the dual wavelength semiconductor laser of the present invention.

And then, after the GaAs substrate 10 is taken out from an MOCVD or MBE reaction chamber, a resist pattern 19 is formed on a red laser formation region by photolithography, and an infrared laser formation region where no mask is formed is removed by using an etching solution of nitric acid or hydrochloric acid with the resist pattern 19 serving as a mask (FIG. 9(B)).

Figure 9C:
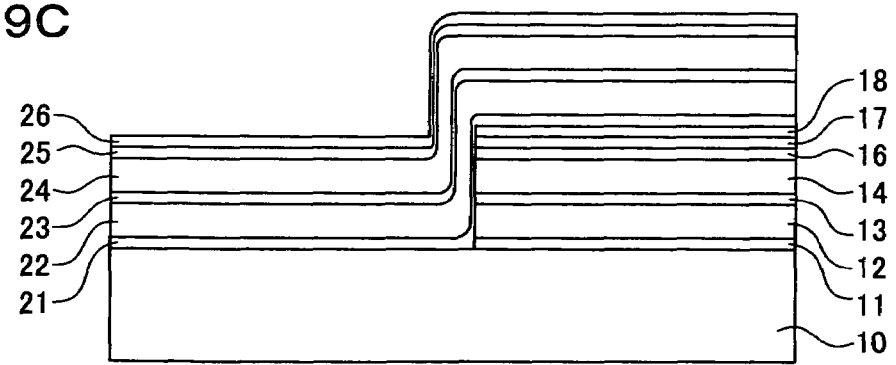
FIG. 9C is a process sectional view showing the process of forming semiconductor layers in the dual wavelength semiconductor laser of the present invention.

After the resist is removed, by using MOCVD method or MBE method, the following layers are formed: the n-type GaAs buffer layer 21 (0.5 μm), the n-type $(Al_{0.7}Ga_{0.3})_{0.51}In_{0.49}P$ clad layer 22 (2.0 μm), the quantum well active layer 23 including the $Al_{0.5}Ga_{0.5}As$ (200 Å) first guide layer 23g1+[GaAs30 Å×3 well layers 23w1 to 23w3+$Al_{0.5}Ga_{0.5}As$ (50 Å×2) barrier layers 23b1 and 23b2]+the $Al_{0.5}Ga_{0.5}As$ (200 Å) second guide layer 23g2, the p-type $(Al_{0.7}Ga_{0.3})_{0.51}In_{0.49}P$ clad layer 24, the p-type $Ga_{0.51}In_{0.49}$ P protective layer 25 (500 Å), and the p-type GaAs contact layer (0.4 μm) 26 (FIG. 9(C)).

Figure 9D:
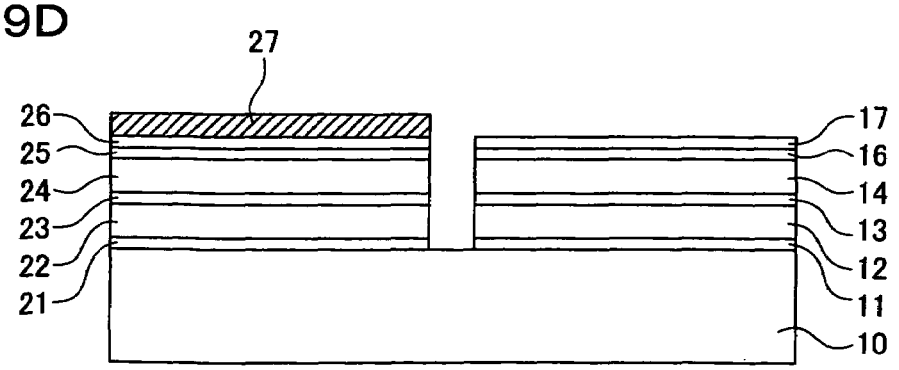
FIG. 9D is a process sectional view showing the process of forming semiconductor layers in the dual wavelength semiconductor laser of the present invention.

And then, a resist pattern 27 is formed on the infrared laser formation region by photolithography, and a part where no mask is formed is removed by etching using an etching solution of nitric acid or hydrochloric acid with the resist pattern 27 serving as a mask, so that only the red laser is left (FIG. 9(D)).

Figure 10A:
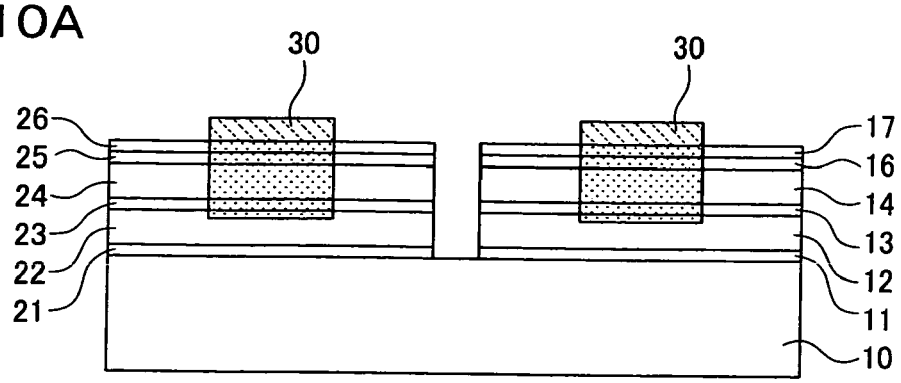
FIG. 10A is a process sectional view showing the process of forming a ridge in the dual wavelength semiconductor laser of the present invention.
Figure 10B:
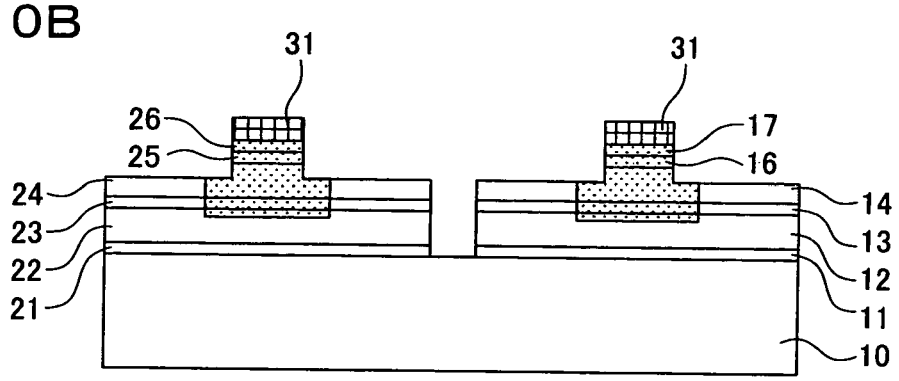
FIG. 10B is a process sectional view showing the process of forming the ridge in the dual wavelength semiconductor laser of the present invention.

Subsequently, after the resist pattern 27 is removed, a Zn diffusion source 30 and a cap film are deposited on the p-type GaAs contact layer (0.4 μm) 17 and the p-type GaAs contact layer 26 by atmospheric pressure thermal CVD (370° C.), patterning is performed thereon by photolithography and dry etching so as to have set window lengths, and then Zn is dispersed into the active layer by annealing to disorder the active layer, so that the window regions are formed (FIG. 10(A)). Also Si may be used as impurity to disorder the quantum well active layer, so that the window regions can be formed. In this case, the quantitative characteristic is similar to that of Zn dispersion.

Subsequently, a silicon oxide film 31 is deposited with a thickness of 0.3 μm on the p-type $Ga_{0.51}In_{0.49}P$ protective layer 16 by atmospheric pressure thermal CVD (370° C.), and the silicon oxide film 31 is patterned by photolithography and dry etching to form a stripe mask. The p-type GaAs contact layer 17, the p-type GaAs contact layer 26, the p-type GaInP protective layer 16, the p-type GaInP protective layer 25, the p-type AlGaInP clad layer 14, and the p-type AlGaInP clad layer 24 are selectively etched in a sequential manner with the stripe-like silicon oxide film 31 serving as a mask, so that ridges are formed like mesas on a heterostructure substrate (FIG. 10(B)).

Figure 10C:
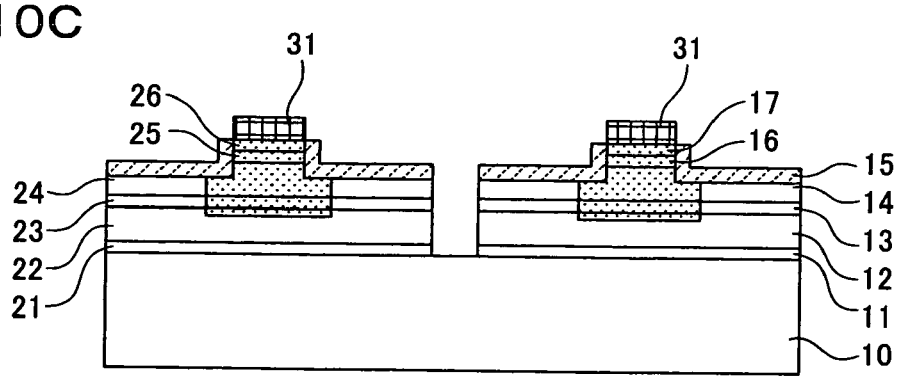
FIG. 10C is a process sectional view showing the process of forming the ridge in the dual wavelength semiconductor laser of the present invention.

After the etching, the GaAs substrate 10 is placed in the MOCVD or MBE reaction chamber again, and the n-type AlInP current block layer 15 (0.7 μm) is selectively grown using the silicon oxide mask (FIG. 10(C)).

Figure 10D:
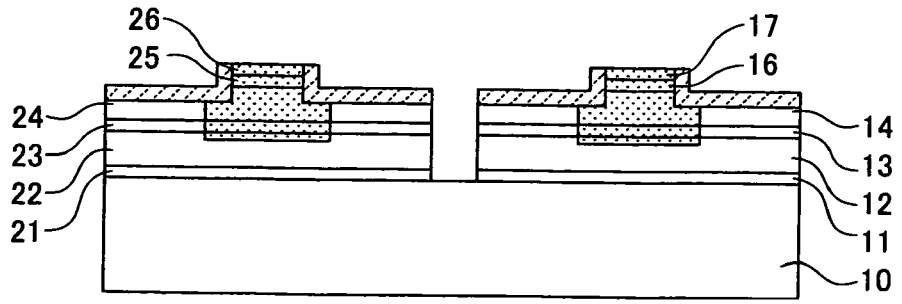
FIG. 10D is a process sectional view showing the process of forming the ridge in the dual wavelength semiconductor laser of the present invention.

Further, the GaAs substrate 10 is taken out from the MOCVD or MBE reaction chamber and the silicon oxide mask is removed using an etching solution of hydrofluoric acid (FIG. 10(D)). When the n-type current block layer is made up of a dielectric film, a ridge is formed like a mesa, the silicon oxide film used as a mask is removed using a solution of hydrofluoric acid, and then a dielectric film is formed over the surface. Thereafter, patterning is performed by photolithography so as to open only the p-type GaAs contact layer 17 and the p-type GaAs contact layer 26 on the tops of the ridges. Subsequently, etching is performed using a solution of hydrofluoric acid. The dielectric film is desirably made of SiN, $SiO_2$, $TiO_2$, $Al_2O_3$, and amorphous silicon hydride, or made up of a multilayer structure thereof in order to have a difference in the index of refraction from the clad layer.

Moreover, the window structures of the red semiconductor laser and the infrared semiconductor laser are formed by the same thermal hysteresis. The amount of Zn diffusion in the clad layer of the window region can be equal between the red semiconductor laser and the infrared semiconductor laser, so that a difference in the index of refraction from the gain section can be obtained with high reproducibility. It is therefore possible to set an optimum value so as to prevent an FFP waveform from fluctuating relative to the set length of the window region.

Further, when simultaneously forming the window regions, the infrared laser made up of the As active layer is one digit lower in diffusion coefficient of Zn than the red laser, so that a wavelength difference Δλ between the gain section and the window section has the relationship of infrared Δλ<red Δλ. When Δλ is large, the maximum wavelength that allows the active layer of the window to have an absorbing function comes close to the wavelength of laser oscillation light, so that a waveguide loss increases in the window. Therefore, in order to reduce the waveguide loss in the window, it is necessary to set the window of the infrared laser shorter than the window of the red laser.

The following will describe output wavelength distribution in the representative window regions of the red laser and the infrared laser.

Figure 11A:
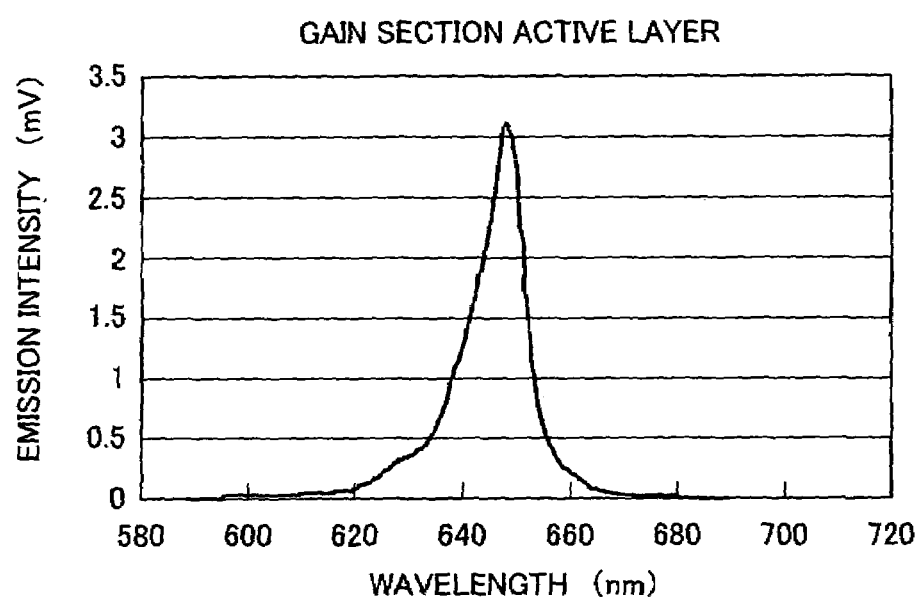
FIG. 11A is an output wavelength distribution diagram in the red semiconductor laser.
Figure 11B:
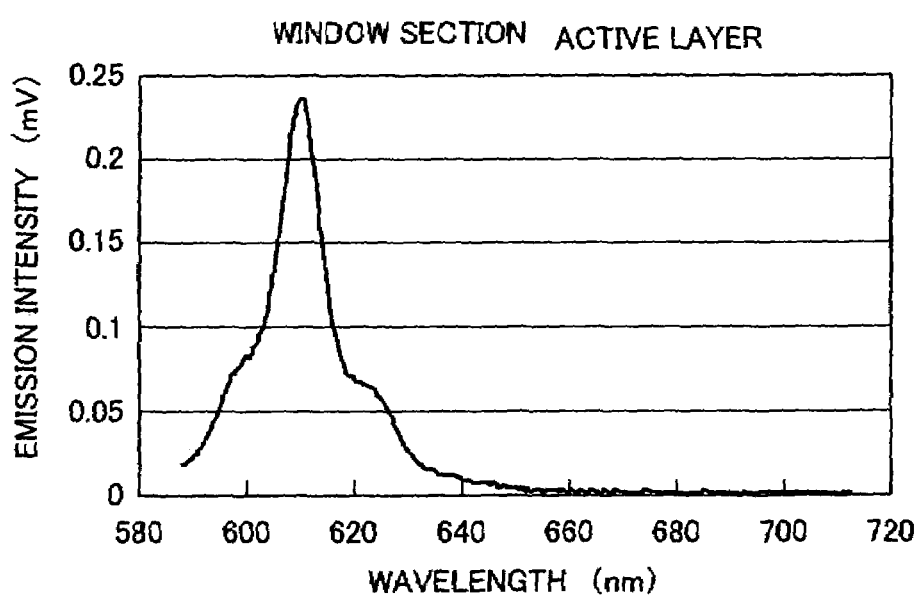
FIG. 11B is an output wavelength distribution diagram in the red semiconductor laser.
Figure 12A:
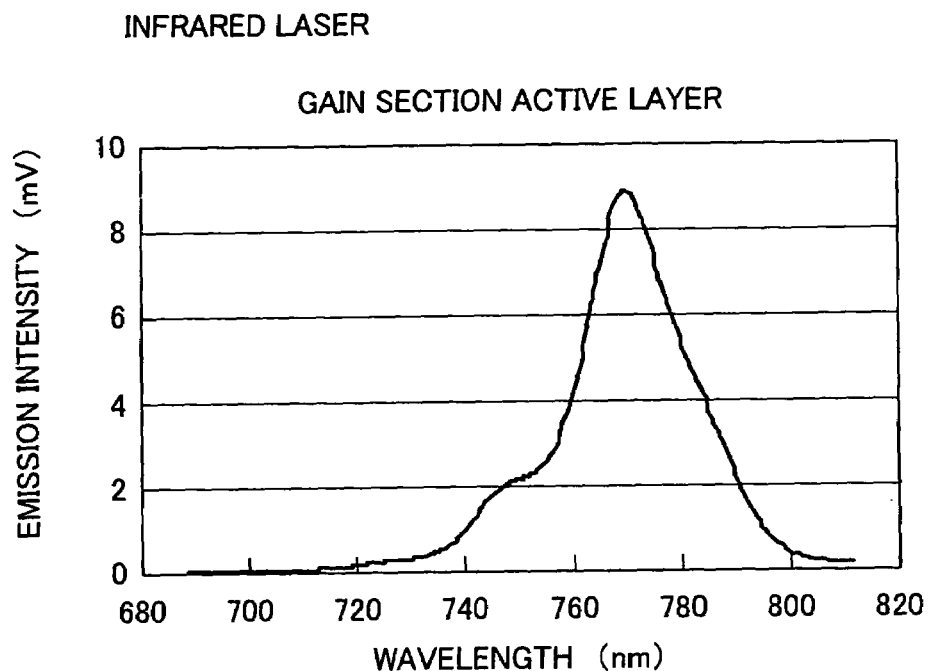
FIG. 12A is an output wavelength distribution diagram in the infrared semiconductor laser.
Figure 12B:
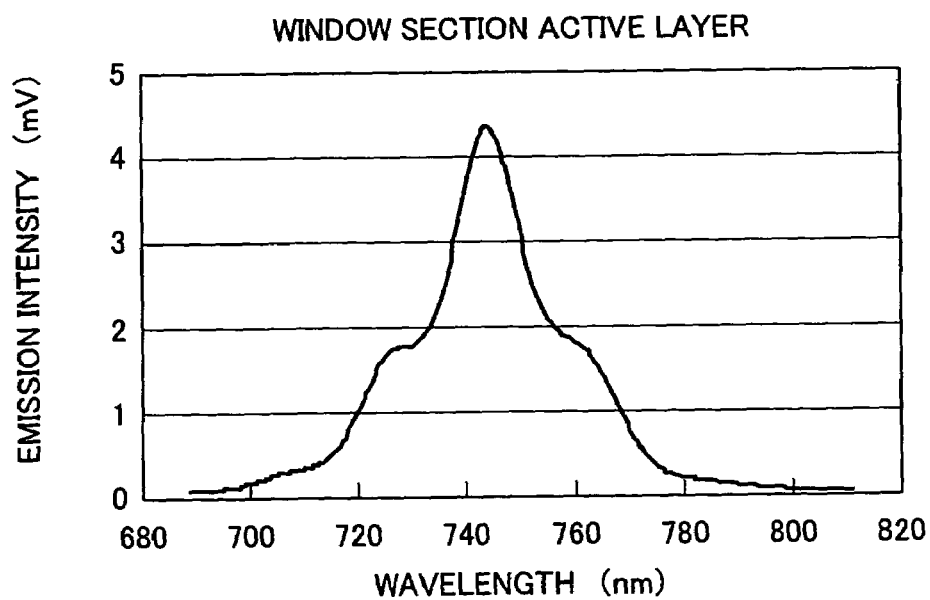
FIG. 12B is an output wavelength distribution diagram in the infrared semiconductor laser.
Figure 13:
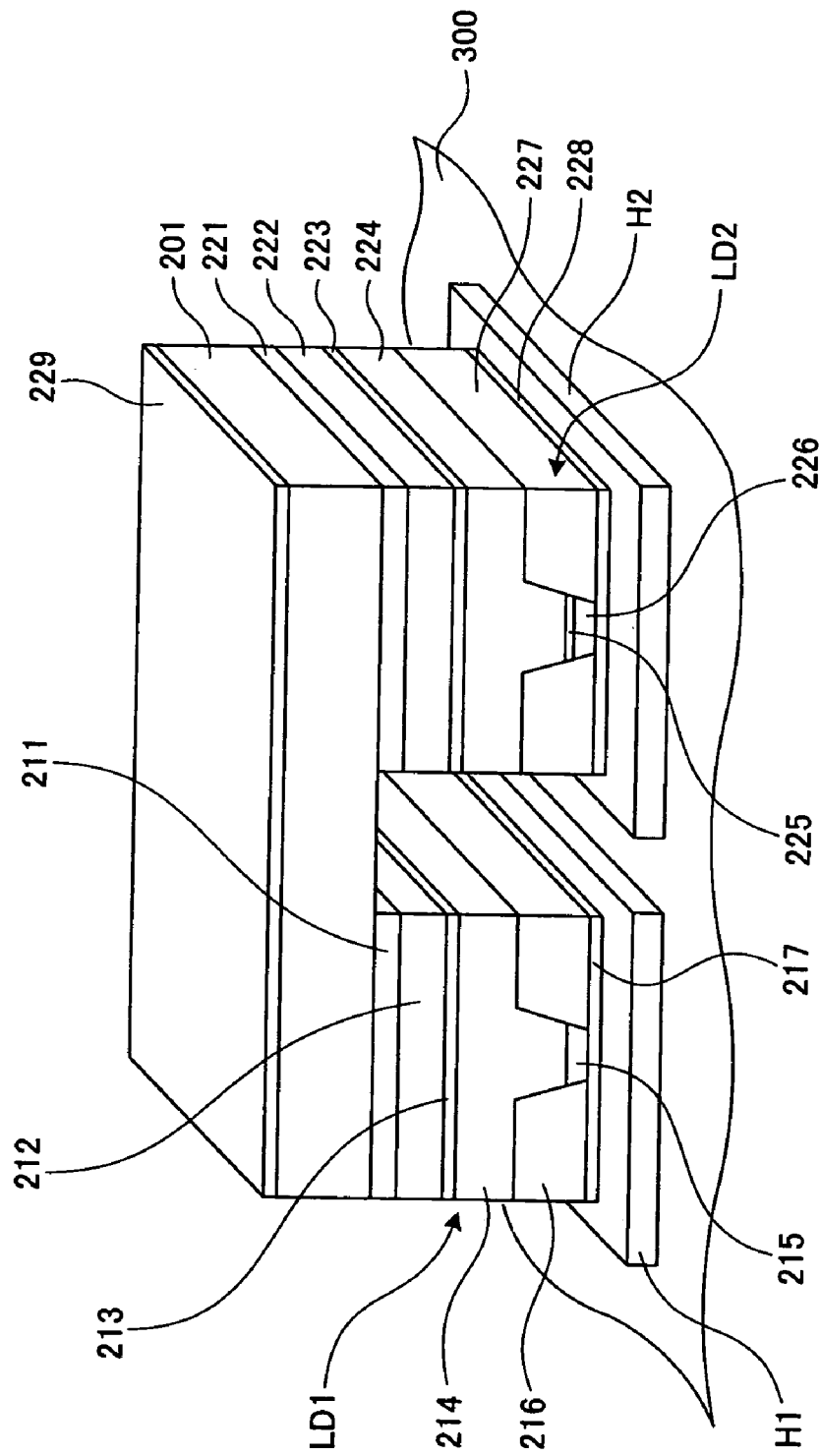
FIG. 13 is a perspective view showing the structure of a conventional multi-wavelength semiconductor laser.

FIG. 11 shows output wavelength distribution diagrams of the red semiconductor laser. FIG. 11(A) is an output wavelength distribution diagram in the gain section, and FIG. 11(B) is an output wavelength distribution diagram of the window section. FIG. 12 shows output wavelength distribution diagrams of the infrared semiconductor laser. FIG. 12(A) is an output wavelength distribution diagram in the gain section, and FIG. 12(B) is an output wavelength distribution diagram of the window section.

In this example, Δλ of the infrared semiconductor laser is 35 nm and Δλ of the red semiconductor laser is 50 nm. In order to secure the COD level of the infrared section, Δλ has to be 20 nm or more. In the present embodiment, the infrared semiconductor laser is 15 μm in window length and the red semiconductor laser is 20 μm in window length.

Further, when forming the window region using Zn as an impurity source, diffusion caused by thermal hysteresis in the resonator direction is significant for the suppression of irregularities of FFP.

In the red semiconductor laser and the infrared semiconductor laser, it is significant to control the diffusion of the window region within 40 μm in the resonator direction relative to a region on which a Zn solid phase source is formed, in order to obtain a stable divergence angle and FFP shape relative to the set window length.

When current is injected to the window, carriers are injected into the active layer of the window and the index of refraction changes, so that the FFP pattern is deformed, the band gap of the active layer of the window is reduced by heat generated in the window, and the COD level decreases. This problem is effectively prevented by removing the p-GaAs contact layer 17 and the p-GaAs contact layer 26 on the windows 40a, 40b, 41a, and 41b so as to prevent current injection to the windows. When the p-GaAs contact layers are removed, it is necessary to set Lc-Lw (ΔL) at 0 or larger where Lc represents a length from the end face of the resonator and Lw represents the length of the window. In consideration of the mask alignment accuracy of the process, large ΔL can positively prevent current injection to the window. However, too large ΔL reduces current injection to the active layer of the gain section around the boundary of the window, and thus the active layer of this part has a loss, which increases an oscillation threshold value, causes nonlinearity in a current-optical output characteristic, and reduces slope efficiency.

Therefore, it is necessary to set ΔL between or equal to 0 and 50 μm. Moreover, an AlGaAs material which is a luminescent material of infrared is larger in absorption coefficient than an InGaP material which is a luminescent material of the red region, so that large ΔL increases a loss of the active layer around the boundary of the window. In order to prevent this problem, infrared ΔL has to be shorter than red ΔL. When ΔL is equal to or smaller than 50 μm, by setting infrared ΔL 5 μm shorter than red ΔL, it is possible to prevent an increase in oscillation threshold value, nonlinearity in the current-optical output characteristic, and a reduction in slope efficiency in the infrared semiconductor laser and the red semiconductor laser.

As described above, in the multi-wavelength semiconductor laser where the plurality of semiconductor lasers with different output wavelengths are monolithically formed, the semiconductor laser having a shorter output wavelength has a longer window region, so that dependence on optical output can be equal between the wavelengths, facilitating the design of an optical system.

Particularly in the dual wavelength semiconductor laser where the red semiconductor laser and the infrared semiconductor laser are monolithically formed, the window region of the infrared semiconductor laser is set shorter than that of the red semiconductor laser, so that dependence on optical output can be equal between wavelengths. It is thus possible to facilitate the design of an optical system, minimize the length of the window region, and increase the length of the gain region, thereby achieving a multi-wavelength semiconductor laser in which the full width at half maximum of FFP changes relative to optical output at almost a constant rate in the red semiconductor laser and the infrared semiconductor laser while obtaining an excellent temperature characteristic. Further, when the red semiconductor laser has a window length of about 30 µm and the infrared semiconductor laser has a window length of about 25 µm, it is possible to obtain a dual wavelength semiconductor laser which can obtain a desired value with stability regardless of optical output.

What is claimed is:

1. A multi-wavelength semiconductor laser in which a plurality of semiconductor lasers with different output wavelengths are monolithically formed on one same substrate, the semiconductor laser, comprising:
   an active layer having a quantum well structure, and
   a mesa-shape ridge on the active layer,
   the semiconductor laser including a window region formed by diffusing impurity on an end face of the active layer, the window region having a different length for each of the plurality of semiconductor lasers,
   wherein one of the plurality of semiconductor lasers is a red semiconductor laser and another of the plurality of semiconductor lasers is an infrared semiconductor laser, and a difference in output wavelength between the active layer of a gain section and the active layer of the window region is larger in the red semiconductor laser than in the infrared semiconductor laser.

2. The multi-wavelength semiconductor laser according to claim 1, wherein the infrared semiconductor laser and the red semiconductor laser are monolithically formed to make up a dual wavelength semiconductor laser.

3. The multi-wavelength semiconductor laser according to claim 1, wherein the semiconductor laser with a shorter output wavelength has a longer window region.

4. The multi-wavelength semiconductor laser according to claim 2, wherein the semiconductor laser with a shorter output wavelength has a longer window region.

5. The multi-wavelength semiconductor laser according to claim 3, wherein a difference in length between the window regions of the semiconductor lasers is 5 to 15 µm.

6. The multi-wavelength semiconductor laser according to claim 4, wherein a difference in length between the window regions of the semiconductor lasers is 5 to 15 µm.

7. The multi-wavelength semiconductor laser according to claim 2, wherein the window region of the red semiconductor laser is 10 to 30 µm in length, the window region of the infrared semiconductor laser is 10 to 25 µm in length, and the window region of the red semiconductor laser is longer than that of the infrared semiconductor laser.

8. The multi-wavelength semiconductor laser according to claim 1, wherein a difference in output wavelength between the active layer of the gain section and the active layer of the window region is 20 nm or more.

9. The multi-wavelength semiconductor laser according to claim 2, wherein the window region is formed by diffusing a same impurity in each of the red semiconductor laser and the infrared semiconductor laser.

10. The multi-wavelength semiconductor laser according to claim 9, wherein the impurity is diffused in the window region and a region within 40 µm from the window region in a resonator direction.

11. The multi-wavelength semiconductor laser according to claim 1, wherein the impurity includes Zn or Si.

12. The multi-wavelength semiconductor laser according to claim 2, wherein the impurity includes Zn or Si.

13. The multi-wavelength semiconductor laser according to claim 1, wherein a same semiconductor layer is formed on a side wall of the mesa-shape ridge in each of the semiconductor lasers.

14. The multi-wavelength semiconductor laser according to claim 13, wherein the semiconductor layer is an AlInP current block layer.

15. The multi-wavelength semiconductor laser according to claim 1, wherein a same dielectric layer is formed on a side wall of the mesa-shape ridge in each of the semiconductor lasers.

16. The multi-wavelength semiconductor laser according to claim 15, wherein the dielectric layer is made of at least one of SiN, $SiO_2$, $TiO_2$, $Al_2O_3$, and amorphous silicon hydride, or a multilayer structure of these materials.

* * * * *